United States Patent
Park et al.

(10) Patent No.: US 10,734,535 B2
(45) Date of Patent: Aug. 4, 2020

(54) COMPOSITION FOR FORMING ELECTRODE, ELECTRODE MANUFACTURED USING THE SAME AND SOLAR CELL

(71) Applicant: SAMSUNG SDI CO., LTD., Yongin-si, Gyeonggi-do (KR)

(72) Inventors: Hyungseok Park, Suwon-si (KR); Sungil Moon, Suwon-si (KR); Hwansung Cheon, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 185 days.

(21) Appl. No.: 15/064,627

(22) Filed: Mar. 9, 2016

(65) Prior Publication Data
US 2017/0054041 A1   Feb. 23, 2017

(30) Foreign Application Priority Data

Aug. 20, 2015   (KR) .......................... 10-2015-0117408
Feb. 29, 2016   (KR) .......................... 10-2016-0024481

(51) Int. Cl.
*H01L 31/0224*   (2006.01)
*H01B 1/22*   (2006.01)
*C08F 220/20*   (2006.01)

(52) U.S. Cl.
CPC ....... *H01L 31/022425* (2013.01); *H01B 1/22* (2013.01); *C08F 220/20* (2013.01)

(58) Field of Classification Search
CPC ........... H01L 31/022425; H01L 31/224; H01L 31/1884; H01B 1/16; H01B 1/22; C08F 220/20

(Continued)

(56) References Cited

U.S. PATENT DOCUMENTS

| 2011/0272022 | A1* | 11/2011 | Dan ................ H01L 31/022425 136/256 |
| 2013/0112261 | A1* | 5/2013 | Lixin .............. H01L 31/022425 136/256 |
| 2015/0315305 | A1* | 11/2015 | Matsumoto .......... C09D 133/04 526/320 |

FOREIGN PATENT DOCUMENTS

| CN | 101937736 A | 1/2011 |
| CN | 101937736 B * | 4/2012 |

(Continued)

OTHER PUBLICATIONS

JP 2011-023599 English machine translation (Year: 2011).*

(Continued)

*Primary Examiner* — Andrew J Golden
(74) *Attorney, Agent, or Firm* — Lee IP Law, P.C.

(57) ABSTRACT

A composition for forming an electrode includes a conductive powder, a glass frit, an organic binder, and a solvent, wherein the organic binder includes a polymer including a first structural unit selected from a structural unit represented by Chemical Formula 1A, a structural unit represented by Chemical Formula 1B, and a combination thereof, and the a second structural unit represented by Chemical Formula 2.

[Chemical Formula 1A]

(Continued)

-continued

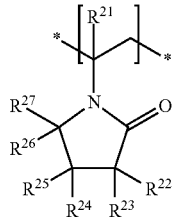

[Chemical Formula 1B]

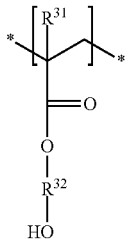

[Chemical Formula 2]

Each substituent of Chemical Formula 1A, Chemical Formula 1B and Chemical Formula 2 is the same as in the detailed description.

13 Claims, 1 Drawing Sheet

(58) Field of Classification Search
USPC .................................................. 136/243–265
See application file for complete search history.

(56) References Cited

FOREIGN PATENT DOCUMENTS

| CN | 102486984 A | 6/2012 | |
|---|---|---|---|
| CN | 103827978 A | 5/2014 | |
| CN | 104204111 A | 12/2014 | |
| CN | 104205244 A | 12/2014 | |
| CN | 104769682 A | 7/2015 | |
| CN | 104822766 A | 8/2015 | |
| CN | 104822767 A | 8/2015 | |
| JP | 2011-023599 A | 2/2011 | |
| JP | WO 2014084273 A1 * | 6/2014 | ........... C09D 133/04 |
| KR | 10-2009-0067991 A | 6/2009 | |
| KR | 10-2012-0129698 A | 11/2012 | |
| WO | WO-2014032808 A1 * | 3/2014 | ............... H01B 1/22 |

OTHER PUBLICATIONS

CN-101937736-B English machine translation (Year: 2012).*
Taiwanese Search Report dated Jul. 27, 2016 in Corresponding Taiwanese Patent Application No. 105108192.
Chinese Office Action dated Jun. 28, 2017 of the corresponding Chinese Patent Application No. 201610157592.7.

* cited by examiner

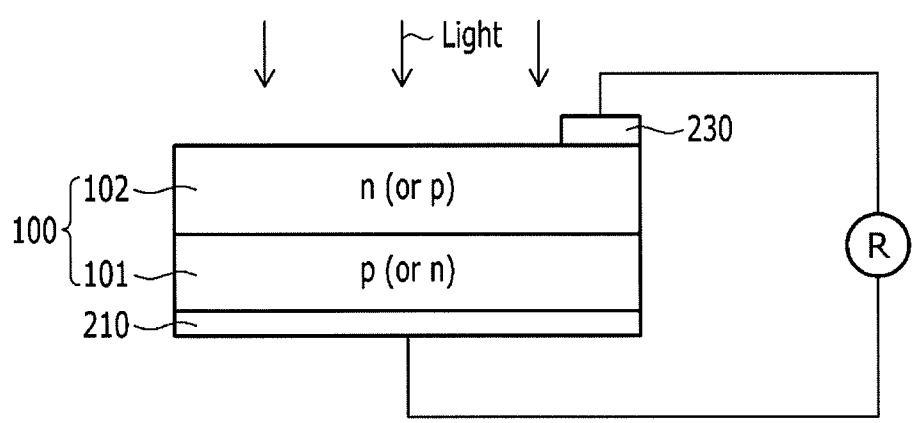

COMPOSITION FOR FORMING ELECTRODE, ELECTRODE MANUFACTURED USING THE SAME AND SOLAR CELL

CROSS-REFERENCE TO RELATED APPLICATION

Korean Patent Application No. 10-2015-0117408, filed on Aug. 20, 2015 and Korean Patent Application No. 10-2016-0024481, filed on Feb. 29, 2016, in the Korean Intellectual Property Office, and entitled: "Composition for Forming Electrode, Electrode Manufactured Using the Same and Solar Cell," is incorporated by reference herein in its entirety.

BACKGROUND

1. Field

Embodiments relate to composition for forming an electrode, an electrode manufactured therefrom, and a solar cell.

2. Description of the Related Art

Solar cells generate electrical energy using the photovoltaic effect of a p-n junction which converts photons of sunlight into electricity. In a solar cell, front and rear electrodes are formed on front and rear surfaces of a semiconductor substrate (semiconductor wafer) with the p-n junction, respectively. Then, the photovoltaic effect of the p-n junction is induced by sunlight entering the substrate and electrons generated by the photovoltaic effect of the p-n junction provide an electric current to the outside through the electrodes.

SUMMARY

Embodiments are directed to an electrode composition, including a conductive powder, a glass frit, an organic binder, and a solvent. The organic binder includes a polymer including a first structural unit selected from a structural unit represented by Chemical Formula 1A, a structural unit represented by Chemical Formula 1B, and a combination thereof, and a second structural unit represented by Chemical Formula 2:

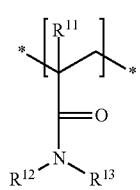

[Chemical Formula 1A]

wherein in Chemical Formula 1A, $R^{11}$ is hydrogen or a methyl group, and $R^{12}$ and $R^{13}$ are independently selected from hydrogen, a halogen, a substituted or unsubstituted linear or branched C1 to C10 alkyl group, and a substituted or unsubstituted C6 to C12 aryl group,

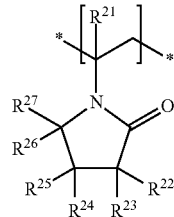

[Chemical Formula 1B]

wherein in Chemical Formula 1B, $R^{21}$ is hydrogen or a methyl group, and $R^{22}$, $R^{23}$, $R^{24}$, $R^{25}$, $R^{26}$, and $R^{27}$ are independently selected from hydrogen and a linear or branched C1 to C10 alkyl group,

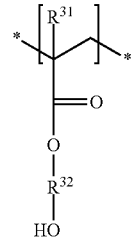

[Chemical Formula 2]

wherein in Chemical Formula 2, $R^{31}$ is hydrogen or a methyl group, and $R^{32}$ is selected from a substituted or unsubstituted linear or branched C2 to C20 alkylene group; a linear or branched C3 to C20 alkylene group where at least one methylene group not being adjacent to an ester group is replaced by a linking group selected from —O—, —S—, —C(=O)—, —S(=O)—, —S(=O)$_2$—, —C(=O)—O—, —O—C(=O)—, —C(O)NR— (wherein R is hydrogen or a C1 to C6 alkyl group) and a combination thereof; a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group; and a combination thereof.

The first structural unit selected from the structural unit represented by Chemical Formula 1A, the structural unit represented by Chemical Formula 1B and a combination thereof and the second structural unit represented by Chemical Formula 2 may be present in a mole ratio of about 5:95 to about 95:5.

The polymer may further include a structural unit represented by Chemical Formula 3:

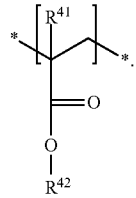

[Chemical Formula 3]

In Chemical Formula 3, $R^{41}$ is independently hydrogen or a methyl group, and $R^{42}$ is independently selected from a substituted or unsubstituted linear or branched C1 to C30 alkyl group, substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

The structural unit of Chemical Formula 3 may be present in an amount of about 1 to about 95 mol % based on 100 mol % of the polymer.

A weight average molecular weight (Mw) of the polymer may be about 1,000 to about 300,000 g/mol.

The composition for forming an electrode may include about 60 to about 95 wt % of the conductive powder; about 0.5 to about 20 wt % of glass fit; about 1 to about 20 wt % of the organic binder; and a balance amount of the solvent.

The glass frit may include at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The solvent may include at least one selected from ethylene glycol monomethyl ether, ethylene glycol monoethylether, ethylene glycol monobutyl ether, aliphatic alcohol, α-terpineol, β-terpineol, dihydro-terpineol, ethylene glycol, ethylene glycol monobutyl ether, 2-butoxyethyl acetate, and 2,2,4-trimethyl-1,3-pentanediol 1-isobutyrate.

The glass frit may have an average particle diameter (D50, volume-based) of about 0.1 μm to about 10 μm.

The composition for forming an electrode may further includes at least one selected from a surface-treatment agent, a dispersing agent, a thixotropic agent, a plasticizer, a viscosity stabilizer, an antifoaming agent, a pigment, an ultraviolet (UV) stabilizer, an antioxidant, and a coupling agent.

Embodiments are also directed to an electrode formed from the composition for forming an electrode.

Embodiments are also directed to a solar cell including the electrode.

BRIEF DESCRIPTION OF THE DRAWING

Features will become apparent to those of skill in the art by describing in detail exemplary embodiments with reference to the attached drawings in which:

FIG. 1 illustrates a schematic view showing the structure of a solar cell according to one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration.

As used herein, when specific definition is not otherwise provided, the term "substituted" refers to one substituted with a halogen (F, Cl, Br, or I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when specific definition is not otherwise provided, the term "hetero" may refer to one substituted with at least one hetero atom of N, O, S and P, instead of at least one C in a cyclic group.

As used herein, (meth)acrylate refers to acrylate and methacylate.

A composition for forming an electrode according to one embodiment may include a conductive powder, a glass frit, an organic binder, and a solvent.

The electrode composition may include a metal powder as a conductive powder. The metal powder may include silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt (Co), zirconium (Zr), iron (Fe), tungsten (W), tin (Sn), chromium (Cr), manganese (Mn), or the like, as examples.

The particle size of the conductive powder may be nanometer or micrometer scale. For example, the conductive powder may have a particle size of dozens to several hundred nanometers, or several to dozens of micrometers. In other embodiments, the conductive powder may be a mixture of two or more types of silver powders having different particle sizes.

The conductive powder may have a particle shape that is spherical, sheet-shape, or amorphous, as examples. The conductive powder may have an average particle diameter (D50, volume-based) of about 0.1 μm to about 10 μm, or, for example, about 0.5 μm to about 5 μm. The average particle diameter may be measured using, for example, Model 1064D (CILAS Co., Ltd.) equipment after dispersing the conductive powder in isopropyl alcohol (IPA) at room temperature (about 24° C. to about 25° C.) for 3 minutes via ultrasonication. Within this range of average particle diameter, the composition may provide low contact resistance and low line resistance.

The conductive powder may be present in an amount of about 60 wt % to about 95 wt % based on 100 wt % of the composition for forming an electrode. Within this range, deterioration in conversion efficiency due to an increase in resistance may be prevented or minimized and hard formation of paste caused by a relative decrease of an organic vehicle may also be prevented or minimized. In one embodiment, the conductive powder may be present in an amount of about 70 wt % to about 90 wt %.

The glass frit may enhance adhesion between the conductive powder and the wafer or substrate. The glass frit may promote the forming of silver crystal grains in an emitter region by etching an anti-reflection layer and melting of the conductive powder so as to reduce contact resistance during a firing process of the electrode paste. During the sintering process, the glass frit may be softened and may decrease the firing temperature.

When the area of the solar cell is increased in order to improve solar cell efficiency, there is a possibility that contact resistance of the solar cell may be increased. Thus, it is desirable to minimize the influence on the p-n junction while minimizing series resistance. The firing temperature may vary within a broad range with increasing use of various wafers having different sheet resistances. It is desirable for the glass frit to secure sufficient thermal stability to withstand a wide range of a firing temperature.

The glass frit may be one or more of a lead glass frit and a non-lead glass frit which are generally used in an electrode composition.

The glass frit may further include at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The glass frit may be prepared from oxides of the elements by any suitable method. For example, the oxides may be obtained by mixing the oxides of the elements in a predetermined ratio, melting the mixture, quenching the resultant, and then pulverizing the quenched product. Mixing may be performed using a ball mill or a planetary mill. The melting may be performed at about 700° C. to about 1300° C. and the quenching may be performed at room temperature (about 20° C. to about 25° C.). The pulverizing may be performed using a disk mill or a planetary mill, as examples.

The glass frit may have an average particle diameter (D50, volume-based) of about 0.1 μm to about 10 μm, and may be present in an amount of about 0.5 wt % to about 20 wt % based on 100 wt % of the composition for forming an electrode. Within this range, the glass frit may secure excellent adhesive strength of an electrode without deteriorating electrical characteristics of an electrode.

The glass frit may have a spherical shape or an amorphous shape. In one embodiment, two different kinds of glass frit having different transition temperatures may be used. For example, a first glass frit having a transition temperature ranging from greater than or equal to about 200° C. to less than or equal to about 350° C. and a second glass frit having a transition temperature ranging from greater than about 350° C. to less than or equal to about 550° C. may be mixed in a weight ratio ranging from about 1:0.2 to about 1:1.

The organic binder may include a polymer including a first structural unit selected from a structural unit represented by Chemical Formula 1A, a structural unit represented by Chemical Formula 1B, and a combination thereof, and a second structural unit represented by Chemical Formula 2.

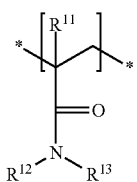

[Chemical Formula 1A]

In Chemical Formula 1A,
$R^{11}$ is hydrogen or a methyl group,
$R^{12}$ and $R^{13}$ are independently selected from hydrogen, a halogen (—F, —Cl, —Br or —I), substituted or unsubstituted linear or branched C1 to C10 alkyl group, and a substituted or unsubstituted C6 to C12 aryl group. For example, the substituted C1 to C10 alkyl group or the substituted C6 to C12 aryl group may be an alkyl group substituted with a hydroxyl group or an aryl group substituted with a hydroxyl group.

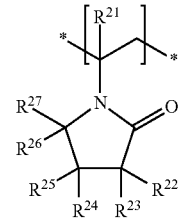

[Chemical Formula 1B]

In Chemical Formula 1B,
$R^{21}$ is hydrogen or a methyl group, and
$R^{22}$, $R^{23}$, $R^{24}$, $R^{25}$, $R^{26}$, and $R^{27}$ are independently selected from hydrogen and a linear or branched C1 to C10 alkyl group.

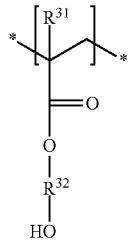

[Chemical Formula 2]

In Chemical Formula 2,
$R^{31}$ is hydrogen or a methyl group, and
$R^{32}$ is selected from a substituted or unsubstituted linear or branched C2 to C20 alkylene group; a linear or branched C3 to C20 alkylene group where at least one methylene group not being adjacent to an ester group is replaced by a linking group selected from —O—, —S—, —C(═O)—, —S(═O)—, —S(═O)$_2$—, —C(═O)—O—, —O—C(═O)—, —C(O)NR— (wherein R is hydrogen or a C1 to C6 alkyl group) and a combination thereof; a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group; and a combination thereof.

The structural unit represented by Chemical Formula 1A has a substituted or unsubstituted acrylamide structure, and the structural unit represented by Chemical Formula 1B has a substituted or unsubstituted pyrrolidone structure. Nitrogen atoms and oxygen atoms of the substituted or unsubstituted acrylamide structure and of the substituted or unsubstituted pyrrolidone structure may induce an electrostatic bond with the conductive powder included in the composition for forming an electrode, and may improve dispersibility of the conductive powder. The structural unit represented by Chemical Formula 2 includes a hydroxyl group and thus may induce a hydrogen bond and improve compatibility and solubility with a solvent. Accordingly, dispersion and storage stability may be improved and a condition wherein a line width increases due to collapse of an electrode pattern during the firing process may be prevented or avoided.

Monomers for providing the structural unit represented by Chemical Formula 1A may be (meth)acrylamide, N-methyl (meth)acrylamide, N-isopropyl (meth)acrylamide, N-butyl (meth)acrylamide, N-isobutyl (meth)acrylamide, N-t-butyl (meth)acrylamide, N-t-octyl (meth)acrylamide, diacetone (meth)acrylamide, N-hydroxy methyl (meth) acrylamide, N-hydroxy ethyl (meth)acrylamide, N-cyclohexyl (meth) acrylamide, N-phenyl (meth)acrylamide, N-benzyl (meth) acrylamide, N-triphenyl methyl(meth) acrylamide, N,N-dimethyl (meth) acrylamide, and the like.

Monomers for providing the structural unit represented by Chemical Formula 1B may be N-vinyl pyrrolidone, N-vinyl-3-methyl pyrrolidone, N-vinyl-5-methyl pyrrolidone, N-vinyl-3,3,5-trimethyl methyl pyrrolidone, and the like.

Monomers for providing the structural unit represented by Chemical Formula 2 may be hydroxy methyl (meth)acrylate, 2-hydroxy ethyl (meth)acrylate, 3-hydroxy propyl (meth)acrylate, 4-hydroxy butyl (meth)acrylate, and the like.

These monomers may be may be used alone or as mixtures of two or more.

The first structural unit selected from the structural unit represented by

Chemical Formula 1A, the structural unit represented by Chemical Formula 1B and a combination thereof, and the second structural unit represented by Chemical Formula 2 may be present in a mole ratio of about 5:95 to about 95:5, or, for example about 20:80 to about 80:20. As discussed herein, the polymer includes the first structural unit and the second structural unit. The first structural unit is selected from a structural unit represented by Chemical Formula 1A, a structural unit represented by Chemical Formula 1B, and a combination thereof. The second structural unit is represented by Chemical Formula 2. Accordingly, in the mole ratio, a sum of moles of the structural unit represented by Chemical Formula 1A, the structural unit represented by Chemical Formula 1B and a combination thereof makes up the first component of the ratio, and moles of the second structural unit represented by Chemical Formula 2 makes up the second component of the mole ratio. When the structural units are used within this range, dispersibility of the conductive powder and compatibility with a solvent may be improved, and an electrode pattern having a fine line width and a high aspect ratio (AR) may be obtained.

When the polymer includes the structural unit represented by Chemical Formula 1A and the structural unit represented by Chemical Formula 1B, the structural unit represented by Chemical Formula 1A and the structural unit represented by Chemical Formula 1B may be present in a mole ratio of about 5:95 to about 95:5, or, for example about 20:80 to about 80:20. When the structural units are used within the range, dispersibility of the conductive powder and compatibility with a solvent may be improved, and an electrode pattern having a fine line width and a high aspect ratio (AR) may be obtained.

The polymer may further include a third structural unit represented by Chemical Formula 3:

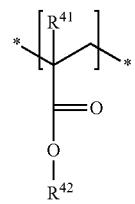

[Chemical Formula 3]

In Chemical Formula 3, $R^{41}$ is independently hydrogen or a methyl group, and $R^{42}$ is independently selected from a substituted or unsubstituted linear or branch C1 to C30 alkyl group, substituted or unsubstituted linear or branched C2 to C30 alkenyl group, substituted or unsubstituted linear or branched C2 to C30 alkynyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

Examples of a monomer that provides the structural unit of Chemical Formula 3 may be methyl(meth)acrylate, ethyl (meth)acrylate, n-butyl(meth)acrylate, iso-butyl(meth)acrylate, t-butyl(meth)acrylate, 2-ethylhexyl(meth)acrylate, isodecyl(meth)acrylate, n-lauryl(meth)acrylate, n-tridecyl (meth)acrylate, pentadecyl(meth)acrylate, cetyl(meth) acrylate, heptadecyl(meth)acrylate, stearyl(meth)acrylate, n-butoxyethyl(meth)acrylate, butoxydiethylene glycol (meth)acrylate, methoxytriethylene glycol(meth)acrylate, methoxynonylethylene glycol(meth)acrylate, cyclohexyl (meth)acrylate, tetrahydrofurfuryl(meth)acrylate, benzyl (meth)acrylate, isobornyl(meth)acrylate, 2-hydroxyethyl (meth)acrylate, 2-hydroxypropyl(meth)acrylate, 2-hydroxybutyl(meth)acrylate, glycidyl (meth)acrylate, 2-phenoxyethyl(meth)acrylate, 2-phenoxydiethylene glycol (meth)acrylate, 2-phenoxytriethylene glycol(meth)acrylate, 2-phenoxytetraethylene glycol(meth)acrylate, 2-phenoxypentaethylene glycol(meth)acrylate, 2-phenoxyhexaethylene glycol(meth)acrylate, 2-phenoxyheptaethylene glycol (meth)acrylate, 2-phenoxyoctaethylene glycol(meth) acrylate, 2-phenoxynonaethylene glycol(meth)acrylate, 2-phenoxydecaethylene glycol(meth)acrylate, and a combination thereof.

The structural unit of Chemical Formula 3 may be present in an amount of about 1 to about 95 mol %, or, for example about 1 to about 80 mol % based on 100 mol % of the polymer including the first structural unit, the second structural unit and the structural unit of Chemical Formula 3. Within these ranges, a fine line width may be realized.

A weight average molecular weight (Mw) of the polymer may be about 1,000 to about 300,000 g/mol. Within this range, dispersibility and print characteristics of composition for forming an electrode may be improved.

The composition for forming an electrode may include about 60 to about 95 wt % of the conductive powder; about 0.5 to about 20 wt % of glass frit; about 1 to about 20 wt % of the organic binder; and a balance amount of the solvent. When the organic binder is used within the range, the electrode composition may have an appropriate viscosity and adherence deterioration to the substrate may be prevented. The organic binder may also have a high resistance to unsmooth decomposition of the organic binder during firing and may help to prevent an electrode from being cracked, being opened, having a pin hole, and the like during the firing.

The solvent may have a boiling point of about 100° C. or more. The solvent may include, for example, The solvent may include at least one selected from ethylene glycol monomethyl ether (for example, methyl CELLOSOLVE), ethylene glycol monoethylether (for example, ethyl CELLOSOLVE), ethylene glycol monobutyl ether (for example, butyl CELLOSOLVE), aliphatic alcohol, α-terpineol, β-terpineol, dihydro-terpineol, ethylene glycol, ethylene glycol monobutyl ether, 2-butoxyethyl acetate (for example, butyl CELLOSOLVE acetate), and 2,2,4-trimethyl-1,3-pentanediol 1-isobutyrate (for example, TEXANOL). These solvents may be used alone or in a combination of two or more.

The solvent may be present in a balance amount, for example about 1 to about 30 wt % based on the total amount of the composition for forming an electrode. When the solvent is used within this range, sufficient adhesion strength and excellent print characteristics may be secured.

The composition for forming an electrode may further include typical additives, as needed, to enhance flow properties, process properties, and stability. The additives may include a surface-treatment agent, a dispersing agent, a thixotropic agent, a plasticizer, a viscosity stabilizer, an antifoaming agent, a pigment, an ultraviolet (UV) stabilizer, an antioxidant, a coupling agent, or the like. These additives may be used alone or as mixtures thereof.

These additives may be present in an amount of about 0.1 to about 5 wt % based on 100 wt % of the composition for forming an electrode. This amount may be adjusted as desired. The amount of the additive may be selected considering print characteristics, dispersion, and storage stability of the composition for forming an electrode.

Another embodiment provides an electrode formed from the composition for forming an electrode.

In addition, another embodiment provides a solar cell including the electrode.

Referring to FIG. 1, a solar cell according to one embodiment is illustrated.

FIG. 1 illustrates a schematic view showing the structure of the solar cell according to one embodiment.

Referring to FIG. 1, an electrode composition may printed on a wafer 100 including a p layer (or an n layer) 101 and an n layer (or a p layer) 102 as an emitter and fired, forming a rear electrode 210 and a front electrode 230. For example, a prior preparation step for the rear electrode may be performed by printing the electrode composition on the rear surface of the wafer and drying at about 200° C. to about 400° C. for about 10 to about 60 seconds.

In addition, a prior preparation step for the front electrode may be performed by printing the electrode composition on the front surface of the wafer and drying the printed electrode composition. Then, the front and rear electrodes may be fired at about 400° C. to about 980° C., or, for example, about 700° C. to about 980° C., for about 30 seconds to about 210 seconds.

The following examples and comparative examples are provided in order to highlight characteristics of one or more embodiments, but it will be understood that the examples and comparative examples are not to be construed as limiting the scope of the embodiments, nor are the comparative examples to be construed as being outside the scope of the embodiments. Further, it will be understood that the embodiments are not limited to the particular details described in the examples and comparative examples.

Synthesis of Organic Binder

Synthesis Example 1

Vinyl pyrrolidone (8 eq), 2-hydroxyethyl methacrylate (2 eq) were added to dimethylsulfoxide (DMSO) (twice as much as the total weight of monomers) in a round-bottomed flask equipped with a condenser under a nitrogen atmosphere. The mixture was heated up to 60° C. while sufficiently stirred. Next, azoisobutyronitrile (AIBN) (0.1 mol % based on 100 mol % of the total weight of monomers) was completely dissolved in dimethylsulfoxide, this solution was added slowly to the mixture in a dropwise fashion through a dropping funnel and reacted at 60° C. under a nitrogen atmosphere for 24 hours. When the reaction was complete, a product therefrom was reprecipitated in n-hexane and filtered, obtaining a polymer (an acryl-based copolymer) having a weight average molecular weight of 130,000 g/mol.

Synthesis Example 2

A polymer (an acryl-based copolymer) having a weight average molecular weight of 130,000 g/mol was obtained according to the same method as Synthesis Example 1 except for using acrylamide (8 eq) instead of the vinyl pyrrolidone (8 eq).

Synthesis Example 3

A polymer (an acryl-based copolymer) having a weight average molecular weight of 130,000 g/mol was obtained according to the same method as Synthesis Example 1 except for using 4 eq of vinyl pyrrolidone instead 8 eq of vinyl pyrrolidone.

Preparation of Composition for Forming Electrode

Example 1

A composition for forming an electrode was prepared by sufficiently dissolving 2.0 wt % of the polymer according to Synthesis Example 1 as an organic binder in 7.5 wt % of TEXANOL (2,2,4-trimethyl-1,3-pentanediol 1-isobutyrate) as a solvent at 50° C., adding 87.0 wt % of spherically-shaped silver powder having an average particle diameter of 5.0 μm (5-8F, Dowa Hightech Co. Ltd.), 3.0 wt % of a low melting-point leaded glass frit having an average particle diameter of 1.0 μm and a transition temperature of 341° C. (CI-124, Particlogy Co., Ltd.), and 0.2 wt % of a dispersing agent (BYK102, BYK-Chemie) and 0.3 wt % of a thixotropic agent (Thixatrol ST, Elementis Co.) as an additive, uniformly mixing these, and dispersing the mixture with a three roll kneader.

Example 2

A composition for forming an electrode was prepared according to the same method as Example 1 except for using the polymer according to Synthesis Example 2 instead of the polymer according to Synthesis Example 1 as the organic binder.

Example 3

A composition for forming an electrode was prepared according to the same method as Example 1 except for using the polymer according to Synthesis Example 3 instead of the polymer according to Synthesis Example 1 as the organic binder.

Comparative Example 1

A composition for forming an electrode was prepared according to the same method as Example 1 except for using benzyl methacrylate (BEMA, Sigma-Aldrich Co., Ltd.) instead of the polymer as the organic binder.

Property Evaluation (1) Storage Stability (%)

Storage stability of the compositions for an electrode was evaluated based on their viscosity variation ratios before and after the storage according to Equation 1. The results are provided in Table 1.

$$\Delta F = \frac{F_1}{F_0} \times 100 \quad \text{[Equation 1]}$$

In Equation 1, $F_0$ is viscosity measured at room temperature (24° C.) after storing an electrode composition at 25° C. under relative humidity of 50±5% for 1 day, and $F_1$ is viscosity measured at room temperature (25° C.) after storing the electrode composition at 25° C. under relative humidity 50±15% for 30 days.

The viscosity measurements were obtained using a viscosity meter (HBDV-2+pro, Brookfield Engineering Laboratories) and mounting SC4-14 spins and a SC4-6RP chamber thereon, and then pre-shearing the compositions at 25° C. and 10 rpm for 30 seconds.

(2) Fine Pattern Evaluation

Each composition for forming an electrode according to Examples 1 to 3 and

Comparative Example 1 was used to screen-print an electrode pattern (a finger bar) on the front side of a poly P-type silicon wafer having sheet resistance of 90Ω with a screen mask and then, the screen-printed electrode pattern was dried using an infrared ray-drying furnace. The rear side of the wafer was printed with a composition for forming an electrode including aluminum and then, the printed composition was dried by the same method described above. Subsequently, a cell manufactured through the above process was fired at 400 to 950° C. for 30 to 50 seconds by using a belt-type furnace. The number of line opening was counted by using an EL tester (MV Tech Inc.) in order to examine whether the manufactured electrodes (finger bars) were disconnected or not. The line width and thickness of an electrode line were measured with a VK equipment (VK9710, KEYENCE Co.), and the results are provided in Table 1.

Screen mask: SUS325 type/Emulsion thickness: 15 μm/Line width of finger bar: 35 μm, The number of finger bars: 90

TABLE 1

| | | Example 1 | Example 2 | Example 3 | Comparative Example 1 |
|---|---|---|---|---|---|
| Composition (wt %) | Silver powder | 87 | 87 | 87 | 87 |
| | Glass frit | 3 | 3 | 3 | 3 |
| | Organic binder | 2 | 2 | 2 | 2 |
| | Organic solvent | 7.5 | 7.5 | 7.5 | 7.5 |
| | Additive | 0.5 | 0.5 | 0.5 | 0.5 |
| Properties | Storage stability (%) | 3 | 2 | 2 | 5 |
| | Line width (L1) after printing (μm) | 48 | 49 | 48 | 63 |
| | Line width (L2) after drying (μm) | 51 | 53 | 52 | 75 |
| | Line width (L3) after firing (μm) | 54 | 56 | 53 | 93 |
| | Thickness (D1) after firing (μm) | 18.7 | 18.9 | 19.1 | 15 |
| | Line width (L1-L2) (μm) | −3 | −4 | −4 | −12 |
| | Aspect ratio (D1/L3) | 0.34 | 0.34 | 0.36 | 0.16 |

Referring to Table 1, the compositions for forming an electrode according to Examples 1 to 3 showed excellent storage stability, a fine line width in an electrode pattern manufactured therefrom, and a high aspect ratio compared with the composition for forming an electrode according to Comparative Example 1.

By way of summation and review, electrodes of a solar cell may be formed with predetermined patterns on the surface of the wafer by coating, patterning, and firing an electrode composition.

The conversion efficiency of the solar cell may be improved by improving contact properties of electrodes with the substrate, and thus minimizing contact resistance (Rc) and series resistance (Rs) or by adjusting pattern line widths of a screen mask with an organic material to be smaller, and thus forming fine lines and increasing a shortcut current (Isc). However, the method of reducing line widths of the electrode pattern with the screen mask may lead to increasing series resistance (Rs) and deteriorating continuous printability of a fine pattern.

The electrode composition may include an organic vehicle to impart suitable viscosity and rheological characteristics for printing. The organic vehicle generally includes an organic binder and a solvent.

The amount of the organic binder may be increased or a polymer having high molecular weight may be used in order to increase dispersion and storage stability.

However, when the amount of the organic binder is increased, resistance may also be increased during formation of an electrode, and when the organic binder having high molecular weight is used, a tailing phenomenon and a printing defect may occur due to increased viscosity even at a high shear rate.

Embodiments provide a composition for forming an electrode capable of forming a fine pattern with a high resolution and having improved print characteristics and improved dispersibility and storage stability. The composition may exhibit excellent print characteristics, dispersion, and storage stability.

Another embodiment provides an electrode manufactured using the electrode composition.

Yet another embodiment provides a solar cell including the electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A composition for forming an electrode, the composition comprising:
   about 60 to about 95 wt % of a conductive powder;
   about 0.5 to about 20 wt % of a leaded glass frit;
   about 1 to about 20 wt % of an organic binder; and
   a solvent,
   wherein the organic binder includes a polymer including a first structural unit selected from a structural unit represented by Chemical Formula 1A, a structural unit represented by Chemical Formula 1B, and a combination thereof, and a second structural unit represented by Chemical Formula 2,

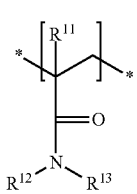

[Chemical Formula 1A]

wherein in Chemical Formula 1A,
$R^{11}$ is hydrogen or a methyl group, and
$R^{12}$ and $R^{13}$ are independently selected from hydrogen, a halogen, a substituted or unsubstituted linear or branched C1 to C10 alkyl group, and a substituted or unsubstituted C6 to C12 aryl group,

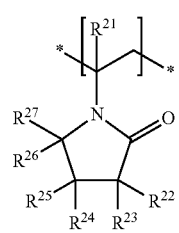

[Chemical Formula 1B]

wherein in Chemical Formula 1B,
$R^{21}$ is hydrogen or a methyl group, and
$R^{22}$, $R^{23}$, $R^{24}$, $R^{25}$, $R^{26}$, and $R^{27}$ are independently selected from hydrogen and a linear or branched C1 to C10 alkyl group,

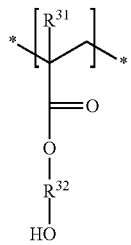

[Chemical Formula 2]

wherein in Chemical Formula 2,
$R^{31}$ is hydrogen or a methyl group, and
$R^{32}$ is selected from a substituted or unsubstituted linear or branched C2 to C20 alkylene group; a linear or branched C3 to C20 alkylene group where at least one methylene group not being adjacent to an ester group is replaced by a linking group selected from —O—, —S—, —C(=O)—, —S(=O)—, —S(=O)$_2$—, —C(=O)—O—, —O—C(=O)—, —C(=O)NR— (wherein R is hydrogen or a C1 to C6 alkyl group) and a combination thereof; a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group; and a combination thereof,
wherein the first structural unit selected from the structural unit represented by Chemical Formula 1A, the structural unit represented by Chemical Formula 1B and a combination thereof and the second structural unit represented by Chemical Formula 2 are present in the polymer in a mole ratio of greater than 50:less than 50 to about 95:5.

2. The composition for forming an electrode as claimed in claim 1, wherein the polymer further includes a structural unit represented by Chemical Formula 3:

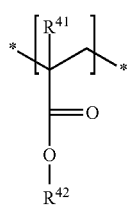

[Chemical Formula 3]

wherein in Chemical Formula 3,
$R^{41}$ is independently hydrogen or a methyl group, and
$R^{42}$ is independently selected from a substituted or unsubstituted linear or branched C1 to C30 alkyl group, substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

3. The composition for forming an electrode as claimed in claim 2, wherein the structural unit of Chemical Formula 3 is present in the polymer in an amount of about 1 to about 95 mol % based on 100 mol % of the polymer.

4. The composition for forming an electrode as claimed in claim 1, wherein a weight average molecular weight (Mw) of the polymer is about 1,000 to about 300,000 g/mol.

5. The composition for forming an electrode as claimed in claim 1, wherein the glass frit includes lead (Pb) and at least one element selected from tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

6. The composition for forming an electrode as claimed in claim 1, wherein the solvent includes at least one selected from ethylene glycol monomethyl ether, ethylene glycol monoethylether, ethylene glycol monobutyl ether, aliphatic alcohol, α-terpineol, β-terpineol, dihydro-terpineol, ethylene glycol, 2-butoxyethyl acetate, and 2,2,4-trimethyl-1,3-pentanediol 1-isobutyrate.

7. The composition for forming an electrode as claimed in claim 1, wherein the glass frit has an average particle diameter (D50) of about 0.1 μm to about 10 μm.

8. The composition for forming an electrode as claimed in claim 1, wherein the composition for forming an electrode further includes at least one selected from a surface-treatment agent, a dispersing agent, a thixotropic agent, a plasticizer, a viscosity stabilizer, an antifoaming agent, a pigment, an ultraviolet (UV) stabilizer, an antioxidant, and a coupling agent.

9. An electrode formed from the composition for forming an electrode as claimed in claim 1.

10. A solar cell comprising the electrode as claimed in claim 9.

11. A composition for forming an electrode, the composition comprising:
about 60 to about 95 wt % of a conductive powder;
about 3 to about 20 wt % of a glass frit;
about 1 to about 20 wt % of an organic binder; and
a solvent,
wherein the organic binder includes a polymer including a first structural represented by Chemical Formula 1B, and a second structural unit represented by Chemical Formula 2:

[Chemical Formula 1B]

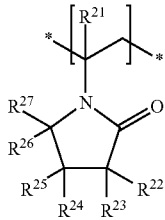

wherein in Chemical Formula 1B,
$R^{21}$ is hydrogen or a methyl group, and
$R^{22}$, $R^{23}$, $R^{24}$, $R^{25}$, $R^{26}$, and $R^{27}$ are independently selected from hydrogen and a linear or branched C1 to C10 alkyl group,

[Chemical Formula 2]

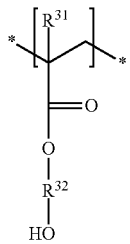

wherein in Chemical Formula 2,
$R^{31}$ is hydrogen or a methyl group, and
$R^{32}$ is selected from a substituted or unsubstituted linear or branched C2 to C20 alkylene group; a linear or branched C3 to C20 alkylene group where at least one methylene group not being adjacent to an ester group is replaced by a linking group selected from —O—, —S—, —C(=O)—, —S(=O)—, —S(=O)$_2$—, —C(=O)—O—, —C(=O)NR— (wherein R is hydrogen or a C1 to C6 alkyl group) and a combination thereof; a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group; and a combination thereof,
wherein the first structural unit represented by Chemical Formula 1B and the second structural unit represented by Chemical Formula 2 are present in the polymer in a mole ratio of greater than 50:less than 50 to about 95:5.

12. A method of forming an electrode, the method comprising:
printing the composition as claimed in claim 1 on a substrate; and
drying the composition.

13. The composition for framing an electrode as claimed in claim 1, wherein:
the first structural unit includes a structural unit represented by Chemical Formula 1A, and
$R^{12}$ and $R^{13}$ are independently selected from hydrogen, a halogen, an unsubstituted linear or branched C1 to C10 alkyl group, and a substituted or unsubstituted C6 to C12 aryl group.

* * * * *